United States Patent
Toda et al.

(10) Patent No.: US 12,274,061 B2
(45) Date of Patent: Apr. 8, 2025

(54) SEMICONDUCTOR DEVICE WITH ADSORPTION PROMOTING LAYER

(71) Applicant: KIOXIA CORPORATION, Tokyo (JP)

(72) Inventors: Masaya Toda, Yokkaichi Mie (JP);
Kota Takahashi, Yokkaichi Mie (JP);
Kazuhiro Matsuo, Kuwana Mie (JP);
Yuta Kamiya, Nagoya Aichi (JP);
Shinji Mori, Nagoya Aichi (JP);
Kenichiro Toratani, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 643 days.

(21) Appl. No.: 17/410,895

(22) Filed: Aug. 24, 2021

(65) Prior Publication Data

US 2022/0189989 A1 Jun. 16, 2022

(30) Foreign Application Priority Data

Dec. 14, 2020 (JP) .................................. 2020-206928

(51) Int. Cl.
*H10B 43/27* (2023.01)
*H01L 21/28* (2006.01)
*H10B 43/35* (2023.01)

(52) U.S. Cl.
CPC ........ *H10B 43/27* (2023.02); *H01L 29/40117* (2019.08); *H10B 43/35* (2023.02)

(58) Field of Classification Search
CPC ........ H10B 69/00; H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10;
(Continued)

(56) References Cited

U.S. PATENT DOCUMENTS 9,397,046 B1 * 7/2016 Sharangpani .......... H10B 43/35
9,406,694 B1 * 8/2016 Ikeno .................... H01L 21/764
(Continued)

FOREIGN PATENT DOCUMENTS

JP 2017168527 A 9/2017
JP 2018078160 A 5/2018
(Continued)

*Primary Examiner* — Didarul A Mazumder
*Assistant Examiner* — Gustavo G Ramallo
(74) *Attorney, Agent, or Firm* — Kim & Stewart LLP

(57) ABSTRACT

A semiconductor device includes a stacked film of electrode layers and insulating layers. A charge storage layer is in a hole in the stacked film on a first insulating film. A channel layer is on the charge storage layer via a second insulating film. An adsorption promoting layer is on surfaces of a third insulating layer covering the insulating layers and the first insulating film facing the electrode layers. The third insulating film includes a first metal element and a first element, and the adsorption promoting layer includes a second element and a third element. The difference in electronegativity between the second element and the third element is larger than a difference in electronegativity between the first metal element and the first element.

14 Claims, 10 Drawing Sheets

(58) Field of Classification Search
CPC ........ H10B 43/20; H10B 43/23; H10B 43/27;
H10B 43/30; H10B 43/35; H10B 43/40;
H10B 43/50; H10B 51/00; H10B 51/10;
H10B 51/20; H10B 51/30; H10B 51/40;
H10B 51/50
See application file for complete search history.

(56) References Cited

U.S. PATENT DOCUMENTS

| | | | |
|---|---|---|---|
| 10,475,806 B2 | 11/2019 | Yagi et al. | |
| 10,475,809 B2 | 11/2019 | Ito et al. | |
| 10,672,478 B2 | 6/2020 | Shirakawa et al. | |
| 10,741,383 B2 | 8/2020 | Noguchi et al. | |
| 2006/0205186 A1* | 9/2006 | Park | C23C 16/45531 257/E21.269 |
| 2006/0257563 A1* | 11/2006 | Doh | C23C 16/45531 427/248.1 |
| 2009/0233434 A1* | 9/2009 | Kim | H01L 21/3145 438/785 |
| 2012/0272827 A1* | 11/2012 | Kamei | C01B 3/56 96/108 |
| 2015/0179662 A1* | 6/2015 | Makala | H01L 29/40114 257/314 |
| 2017/0263627 A1 | 9/2017 | Furuhashi et al. | |
| 2018/0277631 A1 | 9/2018 | Okumura | |
| 2019/0172839 A1 | 6/2019 | Tokuda | |
| 2019/0273092 A1 | 9/2019 | Sasaki et al. | |
| 2020/0091169 A1 | 3/2020 | Tokutomi et al. | |
| 2020/0185402 A1 | 6/2020 | Son et al. | |
| 2022/0139949 A1* | 5/2022 | Sharangpani | H10B 43/35 257/314 |

FOREIGN PATENT DOCUMENTS

| | | |
|---|---|---|
| JP | 2019050243 A | 3/2019 |
| JP | 2019102530 A | 6/2019 |
| JP | 2019153626 A | 9/2019 |
| JP | 2020047321 A | 3/2020 |
| JP | 2020047350 A | 3/2020 |
| JP | 2020096165 A | 6/2020 |
| TW | I663716 B | 6/2019 |

* cited by examiner

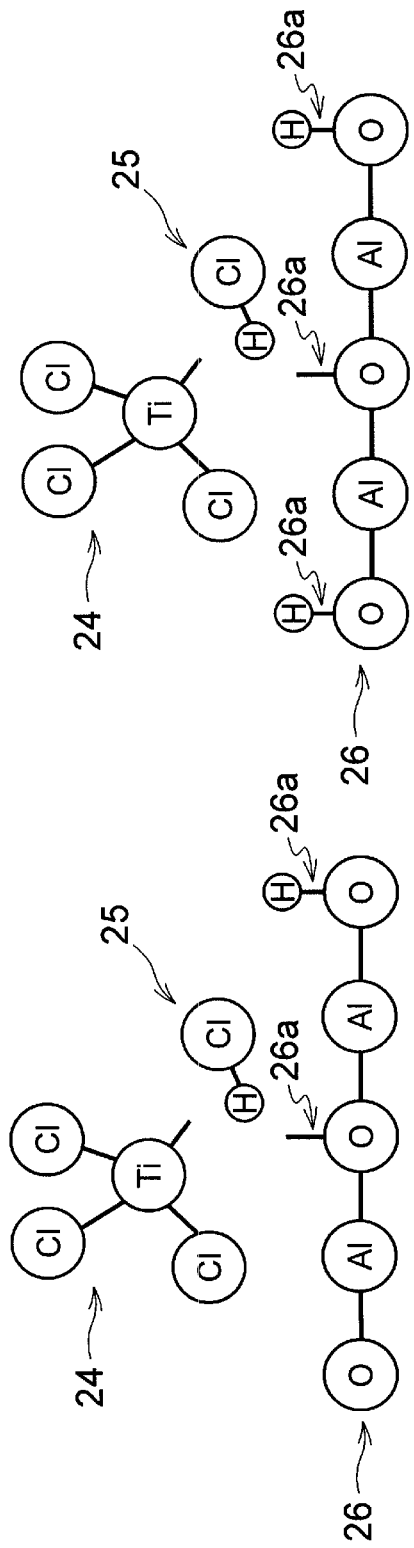

SEMICONDUCTOR DEVICE WITH ADSORPTION PROMOTING LAYER

CROSS-REFERENCE TO RELATED APPLICATION

This application is based upon and claims the benefit of priority from Japanese Patent Application No. 2020-206928, filed Dec. 14, 2020, the entire contents of which are incorporated herein by reference.

FIELD

Embodiments described herein relate generally to a semiconductor device.

BACKGROUND

In some semiconductor devices, two films containing different metal elements such as, for example, an aluminum oxide film of a block insulating film and a titanium nitride film as barrier metal layer in an electrode layer may be disposed near each other. In such a case, there is a risk of one film adversely affecting the other film.

BRIEF DESCRIPTION OF THE DRAWINGS

FIGS. 7A and 7B schematically depict aspects related to an adsorption promoting layer according to a second embodiment.

DETAILED DESCRIPTION

Figure 1:
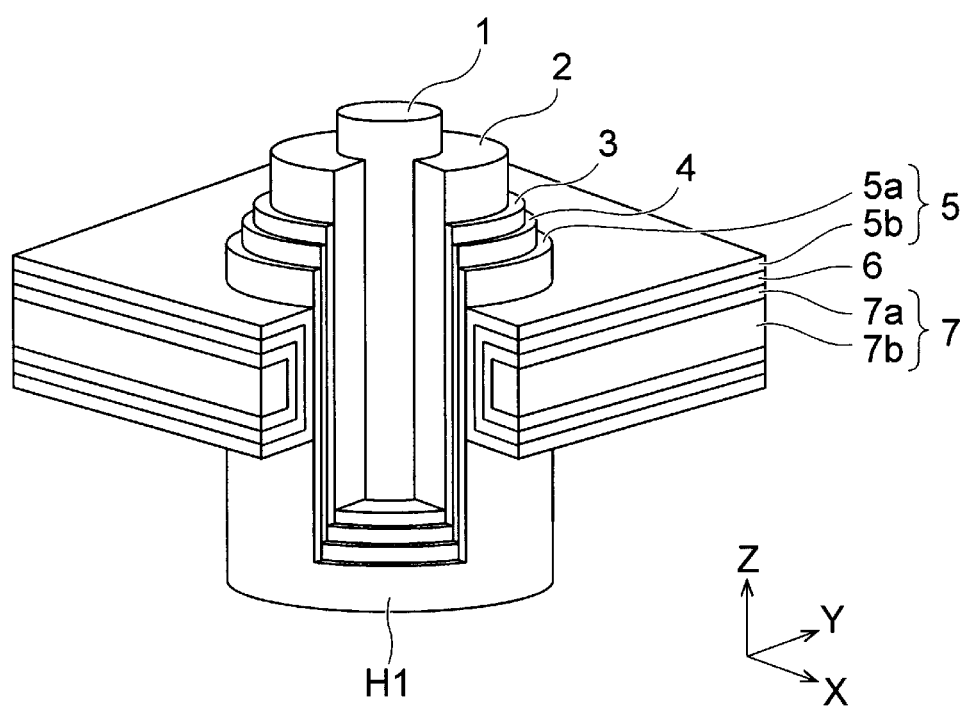
FIG. 1 is a perspective view illustrating a structure in a semiconductor device according to a first embodiment.

In general, according to one embodiment, a semiconductor device includes a stacked film formed of a plurality of electrode layers alternating with a plurality of insulating layers. A channel layer is formed in a hole extending through the stacked film. A charge storage layer is formed between the channel semiconductor layer and the stacked film. A first insulating film is formed on the charge storage layer between the stacked film and charge storage layer. A second insulating film is formed on the channel layer so as to be between the charge storage insulating film and the channel layer. A third insulating film is between each electrode layer and adjacent insulating layers. The third insulating film is also between each electrode layer and the first insulating film. An adsorption promoting layer is formed at the surfaces of the third insulating film facing each electrode layer. The third insulating film comprises a first metal element and a first element. The adsorption promoting layer comprises a second element and a third element. Each electrode layer comprises a second metal element. Each electrode layer includes a first electrode layer and a second electrode layer. The first electrode layer of each electrode layer is between the second electrode layer of the electrode layer and the third insulating layer. The second electrode layer comprises a third metal element. A difference in the electronegativity of the second element and the third element is larger than the difference in electronegativity of the first metal element and the first element.

Hereinafter, certain example embodiments of the present disclosure will be described with reference to the drawings. In the drawings, the same aspects or components will be designated by the same reference numerals, and redundant descriptions thereof may be omitted.

First Embodiment

FIG. 1 is a perspective view illustrating a structure in a semiconductor device of a first embodiment. The semiconductor device of FIG. 1 is, for example, a three-dimensional NAND memory.

The semiconductor device in FIG. 1 has a core insulating film 1, a channel semiconductor layer 2, a tunnel insulating film 3, a charge storage layer 4, a block insulating film 5, an adsorption promoting layer 6, and an electrode layer 7.

The block insulating film 5 comprises an insulating film 5a and an insulating film 5b. The insulating film 5a is an example of a first insulating film, the tunnel insulating film 3 is an example of a second insulating film, and the insulating film 5b is an example of a third insulating film.

The electrode layer 7 comprises a barrier metal layer 7a and an electrode material layer 7b. The barrier metal layer 7a is an example of a first electrode layer, and the electrode material layer 7b is an example of a second electrode layer.

Figure 2:
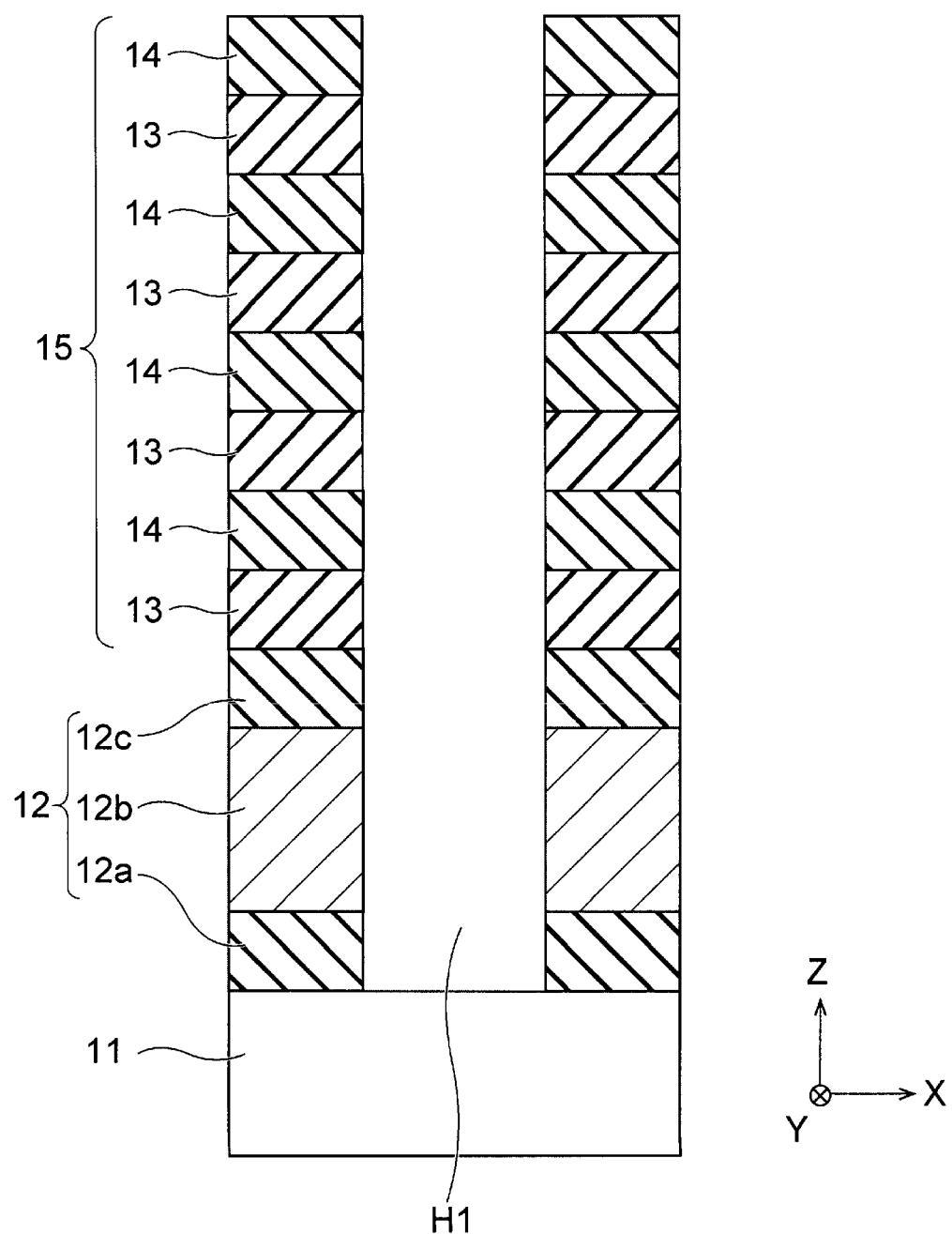
FIGS. 2 to 5 are a cross-sectional views illustrating aspects of a method of manufacturing a semiconductor device according to a first embodiment.
Figure 3:
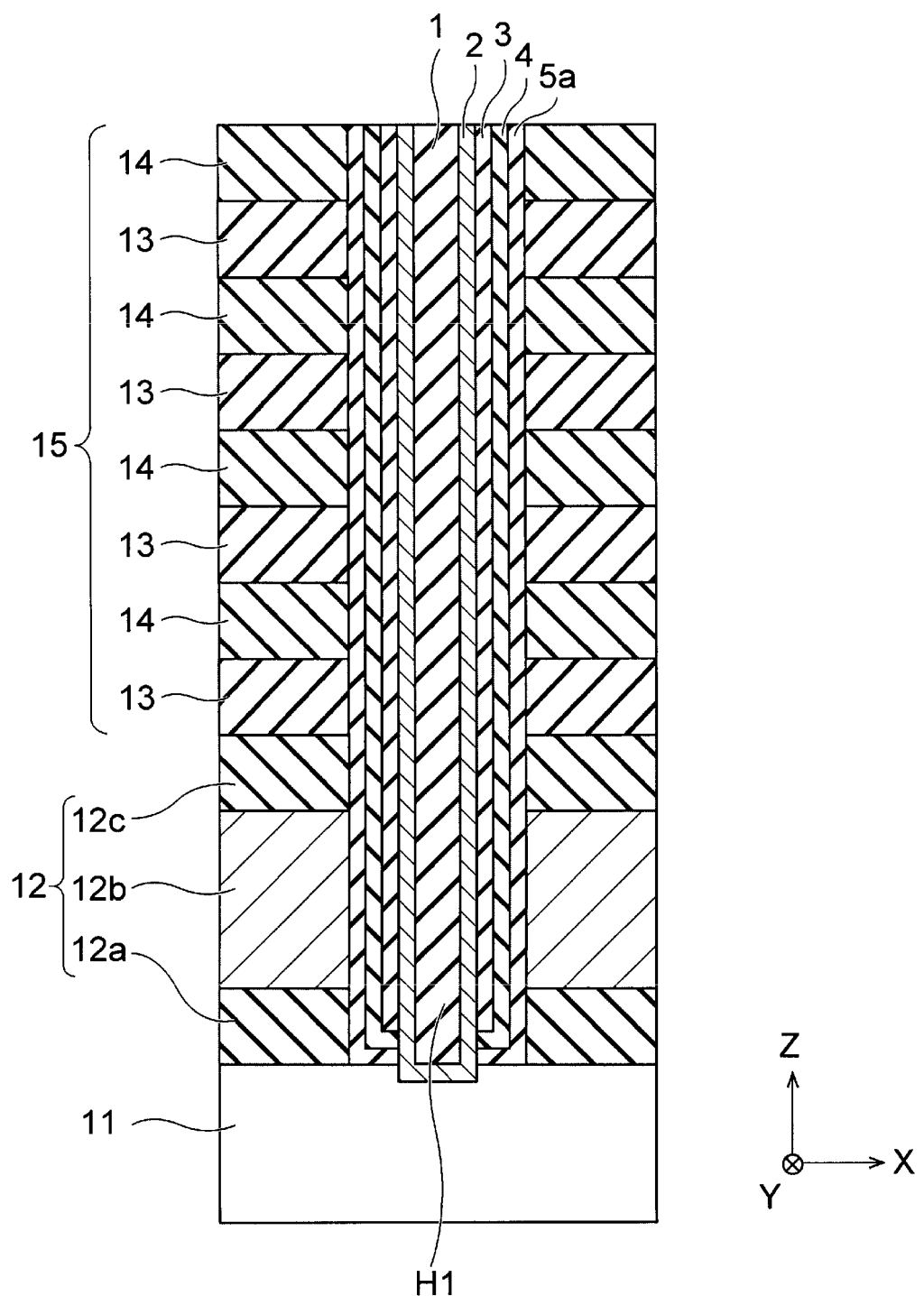
Figure 4:
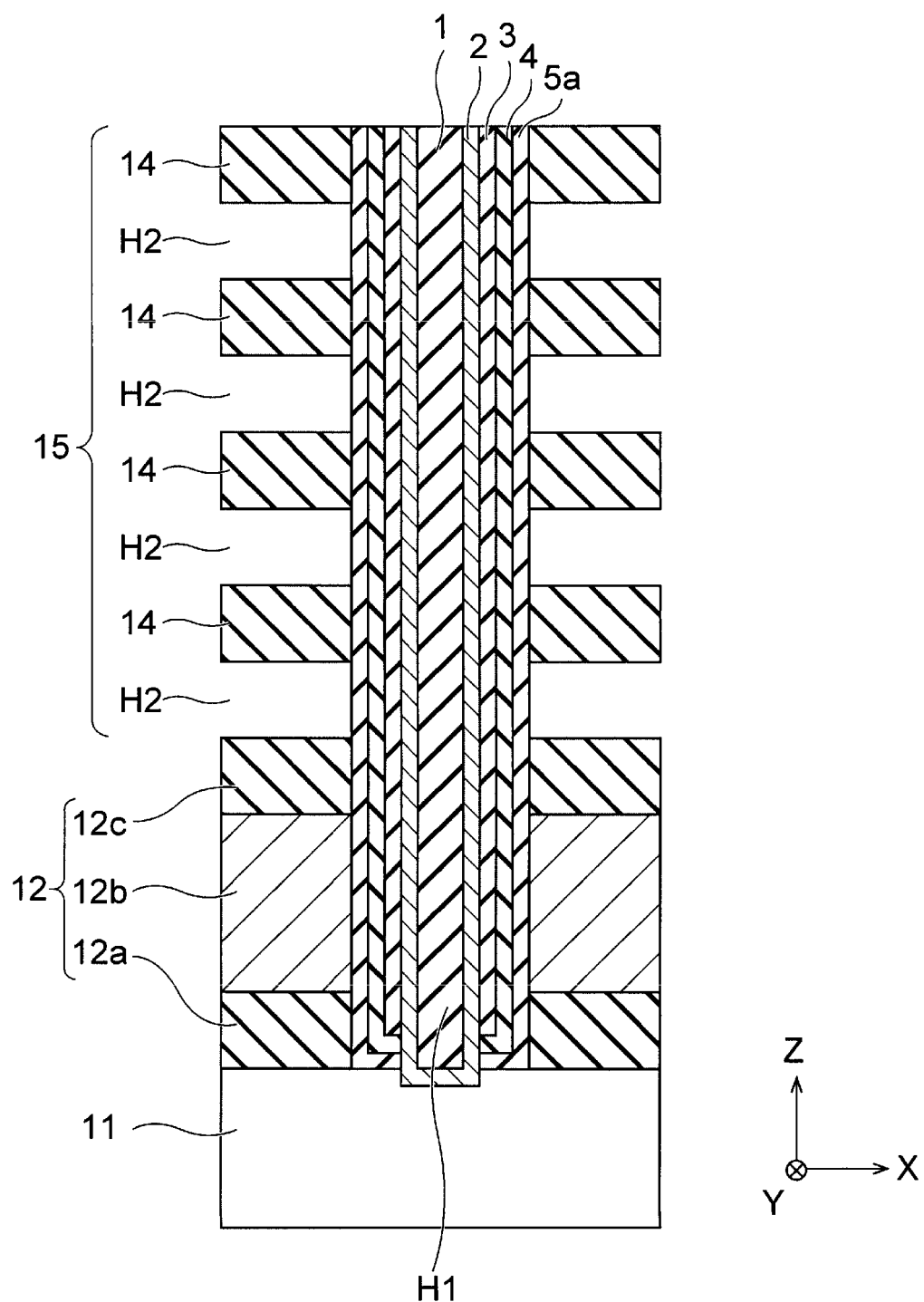

For the semiconductor device depicted in FIG. 1, a plurality of electrode layers 7 and a plurality of insulating layers 14 (see FIG. 2) are alternately stacked on a substrate, and a memory hole H1 is provided in these electrode layers 7 and the insulating layers 14. FIG. 1 illustrates just one electrode layer 7 as representative these electrode layers 7. These electrode layers 7 function as, for example, word lines of a NAND memory. FIG. 1 illustrates the X direction and the Y direction as parallel to the surface of the substrate. The Z direction perpendicular to the surface of the substrate. In the present description, the +Z direction is treated as an upward direction, and the −Z direction is treated as a downward direction. The −Z direction may or may not coincide with the direction of gravity.

The core insulating film 1, the channel semiconductor layer 2, the tunnel insulating film 3, the charge storage layer 4, and the insulating film 5a are formed in the memory hole H1, and collectively form a memory cell of a NAND memory device. The insulating film 5a is formed covering the surfaces of the electrode layer 7 and the insulating layer 14 in the memory hole H1, and the charge storage layer 4 is then formed on the surface of the insulating film 5a. The charge storage layer 4 is capable of storing charges between the outer side surface and the inner side surface. The tunnel insulating film 3 is formed on the surface of the charge storage layer 4, and the channel semiconductor layer 2 is formed on the surface of the tunnel insulating film 3. The channel semiconductor layer 2 functions as a channel of the memory cell. The core insulating film 1 is formed inside of the channel semiconductor layer 2.

The insulating film 5a is, for example, a silicon oxide film ($SiO_2$ film). The charge storage layer 4 is, for example, a silicon nitride film (SiN film). The tunnel insulating film 3 is, for example, a $SiO_2$ film, a silicon oxynitride film (SiON film), or a stacked film containing layers of both $SiO_2$ and SiON. The channel semiconductor layer 2 is, for example, a polysilicon layer. The core insulating film 1 is, for example, a $SiO_2$ film.

The insulating film 5b, the adsorption promoting layer 6 and the barrier metal layer 7a, surround the electrode material layer 7b. An end of the electrode material layer 7b faces the side surface of the insulating film 5a with the insulating film 5b, adsorption promoting layer 6, and the barrier metal layer 7a therebetween.

The insulating film 5b can be, for example, a metal oxide film such as an aluminum oxide film ($Al_2O_3$ film). In the first embodiment, the dielectric constant of the insulating film 5b is different from the dielectric constant of the insulating film 5a, and may be higher than the dielectric constant of the insulating film 5a. This makes it possible to handle the electric field strength during erasing operations and to reduce the leakage current. The aluminum is a first metal element, and oxygen is a first element.

The insulating film 5b may have a high dielectric constant and a high hole barrier height. This makes it possible to reduce the leakage current during writing or erasing operations. The thickness of the insulating film 5b may be 1.5 nm or more. This makes it possible to provide a band gap capable of sufficiently obtaining the effect of barrier height. The insulating film 5b may be formed of an insulating material having a hole barrier height equal to or greater than the hole barrier height of $Al_2O_3$. In some examples, insulating film 5b may be a metal fluoride film such as a lanthanum fluoride film ($LaF_3$ film).

The adsorption promoting layer 6 can be a metal oxide film such as, for example, a hafnium oxide film ($HfO_2$ film). The adsorption promoting layer 6 of the first embodiment is selected so that a source gas used in formation of the barrier metal layer 7a is easily adsorbed at the surface of the insulating film 5b when the barrier metal layer 7a is being formed on the insulating film 5b. In the first embodiment, by using the adsorption promoting layer 6, the source gas can be more easily adsorbed than if the source gas was required to be directly adsorbed on the surface of the insulating film 5b. The adsorption promoting layer 6 of the first embodiment is formed on the upper surface, the lower surface, and the side surface of the insulating film 5b. The adsorption promoting layer 6 in this example is indirect contact with the insulating film 5b. The hafnium and oxygen in the adsorption promoting layer 6 are examples of a second element and a third element, respectively.

The thickness of the adsorption promoting layer 6 may be 0.1 nm or more and 0.5 nm or less. By setting the thickness of the adsorption promoting layer 6 to 0.1 nm or more, it is possible to provide the adsorption promoting layer 6 with a function of adsorbing the source gas. By setting the thickness of the adsorption promoting layer 6 to 0.5 nm or less, it is possible to prevent any substantial increase in the resistance of the electrode layer 7 that might otherwise occur due to the thinning of the electrode layer 7. The adsorption promoting layer 6 of the first embodiment may be provided between the insulating film 5b and the barrier metal layer 7a with such a thin thickness and in such a small amount that it may not be readily detectable as a distinct layer and may be considered more along the lines of a coating or partial film coating.

The barrier metal layer 7a is provided on the adsorption promoting layer 6 side of the electrode layer 7. The barrier metal layer 7a is, for example, a titanium nitride film (TiN film). In the first embodiment, although the electrical resistivity of the barrier metal layer 7a is higher than the electrical resistivity of the electrode material layer 7b, the thickness of the barrier metal layer 7a is only 2.0 nm or less, so that an excessive increase in the resistance of the electrode layer 7 due to the barrier metal layer 7a is prevented. The barrier metal layer 7a is formed on the upper surface, the lower surface, and the side surface of the adsorption promoting layer 6, and is in direct contact with the adsorption promoting layer 6. The titanium in the barrier metal layer 7a is an example of a second metal element.

The electrode material layer 7b is, for example, a tungsten (W) layer. The tungsten in the electrode material layer 7b is an example of a third metal element.

The barrier metal layer 7a may be a material other than a TiN film, and may be, for example, a tantalum nitride film (TaN film) or a tungsten nitride film (WN film). In this case, the tantalum or the tungsten in the barrier metal layer 7a would be an example of the second metal element. The electrode material layer 7b may be a material other than a tungsten layer, and may be, for example, an aluminum (Al) layer, a copper (Cu) layer, or a molybdenum (Mo) layer. In this case, the aluminum, the copper, or the molybdenum in the electrode material layer 7b would be an example of the third metal element.

FIGS. 2 to 5 are cross-sectional views of aspects related to a method of manufacturing a semiconductor device according to a first embodiment.

First, a base layer 12 is formed on a substrate 11. Then a plurality of sacrificial layers 13 and a plurality of insulating layers 14 are alternately formed on the base layer 12 (see FIG. 2). As a result, a stacked film 15 including the alternating sacrificial layers 13 and the insulating layers 14 is formed on the base layer 12. Next, a memory hole H1 penetrating the stacked film 15 and the base layer 12 is formed (see FIG. 2). As a result, the upper surface of the substrate 11 is exposed at the bottom of the memory hole H1.

The substrate 11 is, for example, a semiconductor substrate such as silicon (Si) substrate. The base layer 12 is, for example, a stacked film including an insulating film 12a, a semiconductor layer 12b, and an insulating film 12c which are sequentially formed on the substrate 11. The insulating film 12a is, for example, a $SiO_2$ film or a stacked film including a $SiO_2$ film and another insulating film. The semiconductor layer 12b is, for example, a polysilicon layer. The insulating film 12c is, for example, a $SiO_2$ film or a stacked film including a $SiO_2$ film and another insulating film. The sacrificial layer 13 is, for example, a SiN film. The insulating layer 14 is, for example, a $SiO_2$ film.

Next, the insulating film 5a, the charge storage layer 4, and the tunnel insulating film 3 are sequentially formed in the memory hole H1. As such, exposed surfaces of the substrate 11, the base layer 12, and the stacked film 15 are covered with these sequentially formed films. Next, the insulating film 5a, the charge storage layer 4, and the tunnel insulating film 3 are removed from the bottom of the memory hole H1 by etching. As a result, the upper surface of the substrate 11 is again exposed at the bottom of the memory hole H1. Next, the channel semiconductor layer 2 and the core insulating film 1 are sequentially formed inside the memory hole H1. By this processing, the exposed surfaces of the substrate 11 and the tunnel insulating film 3 are covered (see FIG. 3). The insulating film 5a, the charge storage layer 4, the tunnel insulating film 3, the channel semiconductor layer 2, and the core insulating film 1 have thus been sequentially formed on the side surfaces of the base layer 12 and the stacked film 15 inside the memory hole H1.

Next, a slit (not shown) is formed in the stacked film 15 at a position away from the memory hole H1, and the sacrificial layers 13 are removed using a chemical solution, such as phosphoric acid, introduced via slit. As a result, a plurality of cavities H2 are formed between the insulating layers 14 (see FIG. 4).

Figure 5:
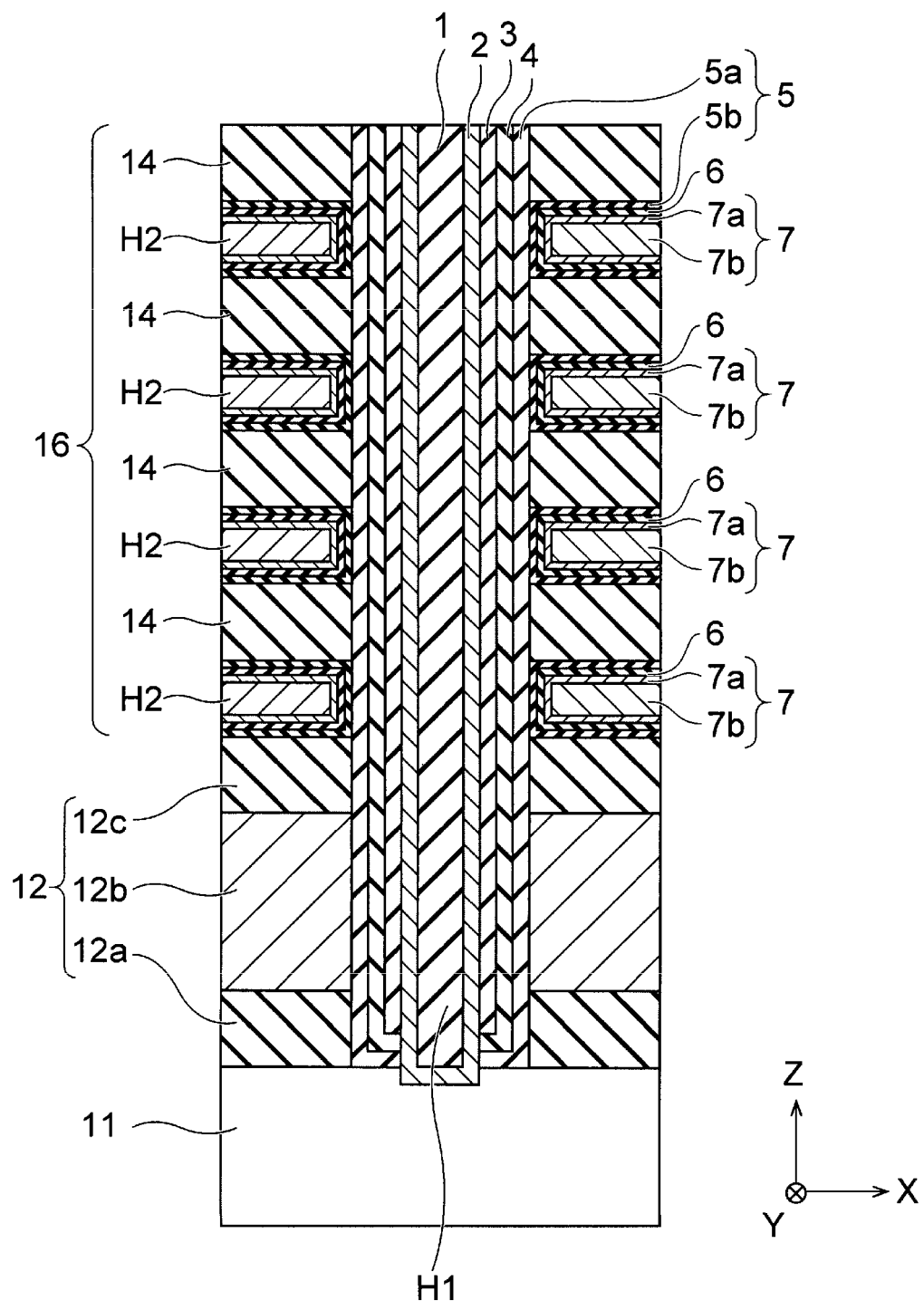

Next, the insulating film 5b, the adsorption promoting layer 6, the barrier metal layer 7a, and the electrode material layer 7b are sequentially formed on the now exposed surfaces of the insulating layers 14 and the insulating film 5a in each cavity H2 (see FIG. 5). As a result, the block insulating film 5 including the insulating film 5a and the insulating film 5b is formed. Next, the electrode layer 7 including the barrier metal layer 7a and the electrode material layer 7b is formed in each cavity H2. A stacked film 16 including the electrode layers 7 and the insulating layers 14 alternately is now on the base layer 12. The barrier metal layer 7a of the first embodiment is a TiN film, and can be formed using titanium tetrachloride ($TiCl_4$) gas as the source gas.

In each cavity H2, the insulating film 5b, the adsorption promoting layer 6, the barrier metal layer 7a, and the electrode material layer 7b are formed between an upper insulating layer 14 and a lower insulating layer 14 (also referred to as an adjacent pair of insulating layers 14). Thus, the insulating film 5b and the adsorption promoting layer 6 are formed in each cavity H2 on the bottom surface of the upper insulating layer 14, the top surface of the lower insulating layer 14. The insulating film 5b and the adsorption promoting layer 6 also are formed on the side surface of the insulating film 5a facing away from the core insulating film 1. In the first embodiment, the insulating film 5b directly contacts the insulating film 5a, and the adsorption promoting layer 6 directly contacts the barrier metal layer 7a.

In this way, a semiconductor device of the first embodiment is manufactured. FIG. 1 illustrates a portion of a semiconductor device illustrated in FIG. 5. The semiconductor device may be referred to as a semiconductor storage device in some instances.

A semiconductor device of the first embodiment, may be manufactured by other processing than may described for the steps illustrated in FIGS. 2 to 5 and/or additional steps may be required or utilized. For example, crystallization annealing for crystallizing each metal layer or a processing for forming a new layer above or below the stacked film 15 or the stacked film 16 may be performed.

Figure 6B:
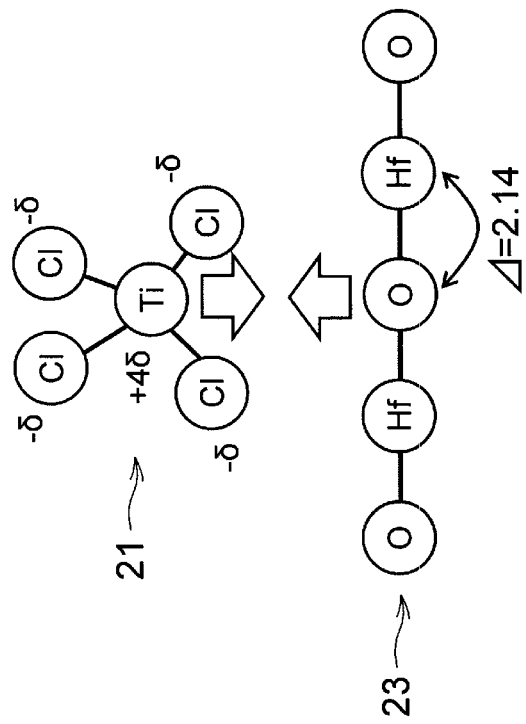
FIGS. 6A and 6B schematically depict aspects related to an adsorption promoting layer according to a first embodiment.
Figure 6A:
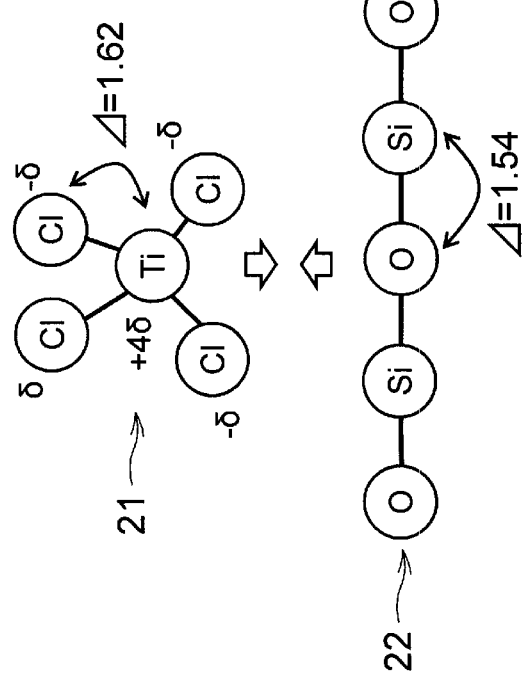

FIGS. 6A and 6B are schematic views illustrating aspects related to the adsorption promoting layer 6 of the first embodiment.

FIG. 6A illustrates a $TiCl_4$ molecule 21 and a $SiO_2$ film 22. The difference in electronegativity between the titanium atom and the chlorine atoms in the $TiCl_4$ molecule 21 is 1.62, and the difference in the electronegativity between the silicon atoms and the oxygen atoms in the $SiO_2$ film 22 is 1.54. FIG. 6A illustrates the process of forming the barrier metal layer 7a (e.g., a TiN film) on the surface of the $SiO_2$ film 22 using $TiCl_4$ gas as a source gas (precursor gas).

When forming the barrier metal layer 7a directly on the surface of the $SiO_2$ film 22, attraction acts between the $TiCl_4$ molecule 21 and the $SiO_2$ film 22, and the $TiCl_4$ molecule 21 approaches the surface of the $SiO_2$ film 22. As a result, a chlorine atom is removed from the $TiCl_4$ molecule 21, so that the $TiCl_4$ molecule 21 changes to a $TiCl_3^+$ ion. The $TiCl_3^+$ ion bonds to a dangling bond (an available bonding site) of the surface of the $SiO_2$ film.

In this way, the barrier metal layer 7a can be formed on the surface of the $SiO_2$ film 22. The ion generated from the $TiCl_4$ molecule 21 may be an ion other than the $TiCl_3^+$ ion. In addition, when the barrier metal layer 7a is to be a TiN film, ammonia ($NH_3$) gas may be used as a source gas along with $TiCl_4$ gas.

The attraction between the $TiCl_4$ molecule 21 and the $SiO_2$ film 22 would increase if the difference in electronegativity between the Si element and the O element in the $SiO_2$ film 22 increased since the dipole moment in the $SiO_2$ film 22 would become larger. When the difference in electronegativity is larger, the attraction becomes larger, and the formation of the barrier metal layer 7a would be further promoted. However, the difference in electronegativity between the Si element and the O element is 1.54. Therefore, the barrier metal layer 7a is unlikely to be formed directly on the surface of the $SiO_2$ film 22.

FIG. 6B illustrates the $TiCl_4$ molecule 21 and a hafnium oxide film ($HfO_x$ film) 23, which is an example of the adsorption promoting layer 6 of the first embodiment. FIG. 6B illustrates a process of forming the barrier metal layer 7a (e.g., a TiN film) on the surface of the adsorption promoting layer 6 ($HfO_x$ film 23) using $TiCl_4$ gas.

The difference in electronegativity between the Hf atoms and the O atoms in the $HfO_x$ film 23 is 2.14. Therefore, the barrier metal layer 7a is more likely to be formed on the surface of the adsorption promoting layer 6. The difference in electronegativity (2.14) between the Hf atoms and the O atoms in the $HfO_x$ film 23 is larger than the difference in electronegativity between the Al atoms and the O atoms (1.83) in the aluminum oxide film (AlO film), which is an example of the insulating film 5b of the first embodiment. Therefore, the barrier metal layer 7a is more likely to be formed on the surface of the adsorption promoting layer 6 than on the surface of the insulating film 5b. Thus, according to the first embodiment, by forming the barrier metal layer 7a on the surface of the insulating film 5b via the adsorption promoting layer 6, rather than directly on the insulating film 5b, it is possible to more easily form the barrier metal layer 7a.

For example, when the barrier metal layer 7a is directly formed on the surface of the insulating film 5b, since the barrier metal layer 7a is not easily formed, there is a risk of the barrier metal layer 7a will have holes, flaws, or the like therein rather than forming a continuous barrier as required. According to the first embodiment, it is possible to prevent such flaws by forming the barrier metal layer 7a indirectly on the surface of the insulating film 5b via inclusion of the adsorption promoting layer 6. According to the first embodiment, it is possible to more fully and reliably form the barrier metal layer 7a and thus to improve the reliability of the memory cell.

In the first embodiment, in order to obtain the above-described effects, the difference in electronegativity between elements in the adsorption promoting layer 6 should be larger than the difference in electronegativity between elements in the insulating film 5b. The adsorption promoting layer 6 may thus be a film other than $HfO_x$ film 23.

For example, the adsorption promoting layer 6 may be an oxide film such as a titanium oxide film ($TiO_x$ film), a zirconium oxide film ($ZrO_x$ film), an yttrium oxide film ($YO_x$ film), a scandium oxide film ($SCO_x$ film), a lanthanum oxide film ($LaO_x$ film), or a tantalum oxide film ($TaO_x$ film).

The adsorption promoting layer 6 may be a chloride film such as a zirconium chloride film ($ZrCl_x$ film), a hafnium chloride film ($HfCl_x$ film), an yttrium chloride film ($YCl_x$ film), or a lanthanum chloride film ($LaCl_x$ film).

The adsorption promoting layer 6 may be a fluoride film such as a silicon fluoride film ($SiF_x$ film), a titanium fluoride film ($TiF_x$ film), a zirconium fluoride film ($ZrF_x$ film), a hafnium fluoride film ($HfF_x$ film), an yttrium fluoride film ($YF_x$ film), a scandium fluoride film ($ScF_x$ film), a lanthanum fluoride film ($LaF_x$ film), a tantalum fluoride film ($TaF_x$ film), or a vanadium fluoride film ($VF_x$ film).

In some examples, adsorption promoting layer 6 may be a combination of two or more materials described above. For example, the adsorption promoting layer 6 may be a stacked film containing a $TiO_x$ film and a $ZrCl_x$ film, or may be a mixed film containing materials formed of Ti atoms, oxygen atoms, Zr atoms, and chlorine atoms.

As described above, the difference in electronegativity between elements in the adsorption promoting layer 6 is set to be larger than the difference in electronegativity between elements in the insulating film 5b. Thus, according to the first embodiment, it is possible to suitably form the barrier metal layer 7a on the surface of the insulating film 5b via the adsorption promoting layer 6.

The adsorption promoting layer 6 of the first embodiment may contain other element(s) in addition to a metal element (such as Hf) and a non-metal element (such as oxygen). For example, the adsorption promotion layer 6 may contain aluminum, oxygen, hydrogen (H), boron (B), carbon (C), nitrogen (N), gallium (Ga), germanium (Ge), or arsenic (As). Furthermore, in some examples, the adsorption promoting layer 6 may contain aluminum, oxygen, and a noble gas element such as helium (He), neon (Ne), or argon (Ar).

Second Embodiment

A semiconductor device of the second embodiment has the structure illustrated in FIG. 1, and is also manufactured by the method illustrated in FIGS. 2 to 5. However, the adsorption promoting layer 6 of the second embodiment is formed of a material different from that of the adsorption promoting layer 6 of the first embodiment.

FIGS. 7A and 7B are schematic views illustrating aspects related to the adsorption promoting layer 6 of the second embodiment.

FIG. 7A illustrates a $TiCl_3^+$ ion 24, an HCl molecule 25, an aluminum oxide film ($AlO_x$ film) 26 (which is an example of the insulating film 5b), and dangling bonds 26a at the surface of the $AlO_x$ film 26. FIG. 7A illustrates a process of forming the barrier metal layer 7a (e.g., a TiN film) directly on the surface of the insulating film 5b ($AlO_x$ film 26) using $TiCl_4$ gas as the source gas.

In FIG. 7A, with the reaction of a $TiCl_4$ molecule in the $TiCl_4$ gas and a hydrogen (H) atom bonded to the dangling bond 26a of the $AlO_x$ film 26, the $TiCl_3^+$ ion 24 and the HCl molecule 25 are generated. Thus, the $TiCl_3^+$ ion 24 may be bonded to the dangling bonds 26a of the $AlO_x$ film 26, and the barrier metal layer 7a is formed on the surface of the $AlO_x$ film 26.

FIG. 7B illustrates the $TiCl_3^+$ ion 24, the HCl molecule 25, the $AlO_x$ film 26, and the dangling bonds 26a of the surface of the $AlO_x$ film 26, as in FIG. 7A. However, the $AlO_x$ film 26 illustrated in FIG. 7B has more dangling bonds 26a than the $AlO_x$ film 26 illustrated in FIG. 7A. Thus, the $TiCl_3^+$ ion 24 is more likely to be bonded to the $AlO_x$ film 26, and the barrier metal layer 7a is more likely to be formed on the surface of the $AlO_x$ film 26.

Formation of the barrier metal layer 7a of the second embodiment is promoted by increasing the number of dangling bonds 26a.

Figure 8A:
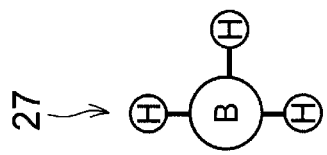
FIGS. 8A to 8C schematically depict additional aspects related to an adsorption promoting layer according to a second embodiment.
Figure 8B:
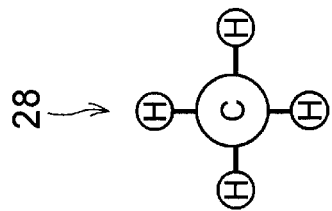
Figure 8C:
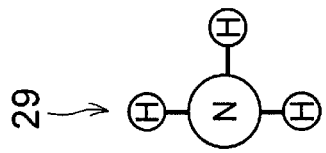

FIGS. 8A to 8C are schematic views illustrating aspects related to the adsorption promoting layer 6 of the second embodiment.

FIG. 8A, FIG. 8B, and FIG. 8C illustrate a monoborane ($BH_3$) molecule 27, a methane ($CH_4$) molecule 28, and an ammonia ($NH_3$) molecule 29, respectively. Group 13 elements such as boron (B), Group 14 elements such as carbon (C), or Group 15 elements such as nitrogen (N) have unpaired electrons. Therefore, the $BH_3$ molecule 27, the $CH_4$ molecule 28, or the $NH_3$ molecule 29 may result in more dangling bonds.

Figure 9A:
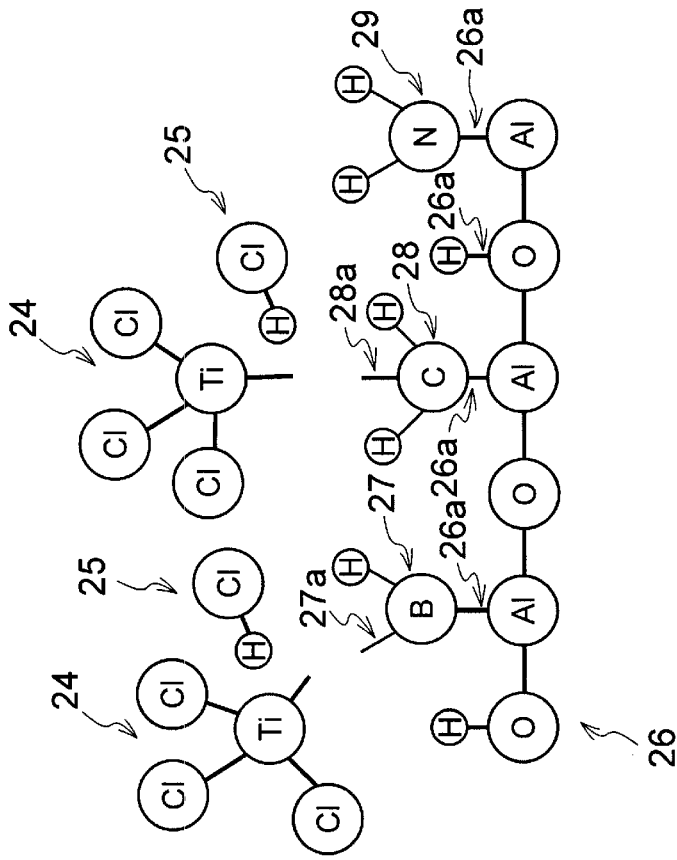
FIGS. 9A and 9B schematically depict additional aspects related to an adsorption promoting layer according to a second embodiment.
Figure 9B:
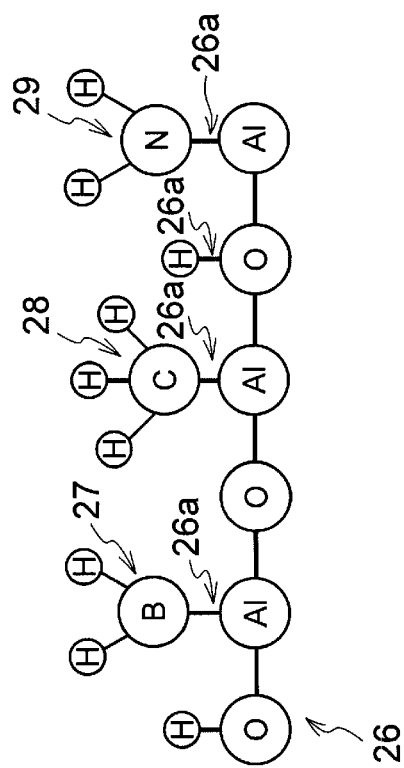

FIGS. 9A and 9B are other schematic views illustrating aspects related to the adsorption promoting layer 6 of the second embodiment.

FIG. 9A illustrates the $AlO_x$ film 26 and the dangling bonds 26a at the surface of the $AlO_x$ film 26. FIG. 9A further illustrates a $BH_3$ molecule 27 changed to a $BH_2^-$ ion and bonded to a dangling bond 26a of $AlO_x$ film 26, a $CH_4$ molecule 28 has changed to a $CH_3^-$ ion bonded to a dangling bond 26a, and a $NH_3$ molecule 29 changed to a $NH_2^-$ ion and bonded to a dangling bond 26a.

In the second embodiment, in a step illustrated in FIG. 5, at least one of the $BH_3$ molecule 27, the $CH_4$ molecule 28, and the $NH_3$ molecule 29 is adsorbed (bonded) to the surface of the insulating film 5b ($AlO_x$ film 26) in the manner illustrated in FIG. 9A. As a result, the adsorption promoting layer 6 containing a hydrogen atom and at least one of a boron, carbon, or nitrogen compound is formed on the surface of the insulating film 5b. The hydrogen is an example of the second element, and boron, carbon, nitrogen are examples of the third element.

The adsorption promoting layer 6 of the second embodiment may contain a metal element such as aluminum and a non-metal element such as oxygen in addition to hydrogen and at least one of boron, carbon, and nitrogen. For example, when the adsorption promoting layer 6 is formed by capture of a $BH_3$ molecule 27 by the $AlO_x$ film 26 at the surface of the $AlO_x$ film 26, the adsorption promoting layer 6 contains hydrogen, boron, aluminum, and oxygen since it is formed by reaction at the surface of the $AlO_x$ film 26.

FIG. 9B illustrates $TiCl_3^+$ ions 24, HCl molecules 25, the $AlO_x$ film 26, and the dangling bonds 26a at the surface of the $AlO_x$ film 26. FIG. 9B further illustrates a $BH_3$ molecule 27 that has formed a $BH_2^-$ ion bonded to one of the dangling bonds 26a of the $AlO_x$ film 26, a $CH_4$ molecule 28 that has formed a $CH_3^-$ ion bonded to one of the dangling bond 26a of the $AlO_x$ film 26, and a $NH_3$ molecule 29 that has formed the $NH_2^-$ ion bonded to one of the dangling bond 26a of the $AlO_x$ film 26.

In FIG. 9B, the $TiCl_3^+$ ions 24 may bond to a dangling bond 27a derived from a $BH_3$ molecule 27, a dangling bond 28a derived from a $CH_4$ molecule 28, or a dangling bond derived from a $NH_3$ molecule 29. That is, the $TiCl_3^+$ ion 24 may be bonded to a dangling bond of the adsorption promoting layer 6 rather than a dangling bond 26a of the $AlO_x$ film 26. Thus, the barrier metal layer 7a can be formed on the surface of the insulating film 5b via the adsorption promoting layer 6.

Each $BH_3$ molecule 27 in FIG. 9B may result in a maximum of 2 dangling bonds, each $CH_4$ molecule 28 may result in a maximum of 3 dangling bonds, and each $NH_3$ molecule 29 may result in a maximum of two dangling bonds. Thus, according to the second embodiment, by supplying $BH_3$ molecules 27, $CH_4$ molecules 28 or $NH_3$ molecules 29 to the surface of the insulating film 5b ($AlO_x$ film 26), it is possible to promote bonding of $TiCl_3^+$ ions 24 to the surface of the insulating film 5b ($AlO_x$ film 26). That is, according to the second embodiment, by forming the adsorption promoting layer 6 on the surface of the insulating film 5b, it is possible to promote the formation of the barrier metal layer 7a on the surface (via the adsorption promoting layer) of the insulating film 5b 6.

The promoter molecule bonded to the surface of the $AlO_x$ film 26 may include Group 13 to 15 elements other than boron, carbon, or nitrogen. For example, the promoter molecule bonded to the surface of the $AlO_x$ film 26 may contain gallium (Ga) atoms, germanium (Ge) atoms, and/or arsenic (As) atoms and still obtain the similar effects as illustrated in FIG. 9B. However, since the atomic radius of boron, carbon, and nitrogen is relatively small, it is possible to form the adsorption promoting layer 6 containing atoms at a high density. On the other hand, when gallium, germanium, or arsenic is used, it can be possible to limit the diffusion of atoms in the adsorption promoting layer 6 since the atomic weight of these elements is large.

Further, the surface concentration (also referred to as dose amount in this context) of the B, C, N, Ga, Ge, or As atoms of the adsorption promoting layer 6 of the second embodiment may be between $1.0 \times 10^{13}$ atoms/cm$^2$ and $1.0 \times 10^{16}$ atoms/cm$^2$. By setting the dose amount to $1.0 \times 10^{13}$ atoms/cm$^2$ or more, it is possible to provide the adsorption promoting layer 6 with enough bonding sites to promote adsorbing of the source gas. By setting the dose amount to $1.0 \times 10^{16}$ atoms/cm$^2$ or less, it is possible to prevent increases in the leakage current due to the presence of the adsorption promoting layer 6 in the final semiconductor device.

Further, the B, C, N, Ga, Ge, or As atoms may not be contained strictly within in an adsorption promoting layer 6 but also may be in portions of the insulating film 5b. In such a case, the atomic concentration (atoms/cm$^3$) of the B, C, N, Ga, Ge, and/or As atoms in the adsorption promoting layer 6 will generally be higher than the atomic concentration of B, C, N, Ga, Ge, or As in the insulating film 5b. This makes it possible to prevent an increase in the leakage current due to the insulating film 5b.

As described above, the adsorption promoting layer 6 of the second embodiment contains Group 13 to 15 elements such as boron, carbon, nitrogen, gallium, germanium, and arsenic. Thus, according to the second embodiment, it is possible to suitably form the barrier metal layer 7a on the surface of the insulating film 5b via the adsorption promoting layer 6.

The adsorption promoting layer 6 of the second embodiment may further contain a noble gas element such as a helium (He) element, a neon (Ne) element, or an argon (Ar) element. An example of the adsorption promoting layer 6 containing a noble gas element will be described for the third embodiment.

Third Embodiment

A semiconductor device of the third embodiment has the structure illustrated in FIG. 1 and is manufactured by the method illustrated in FIGS. 2 to 5. However, the adsorption promoting layer 6 of the third embodiment is formed of a material different from that of the adsorption promoting layer 6 of the first and second embodiments.

Figure 10B:
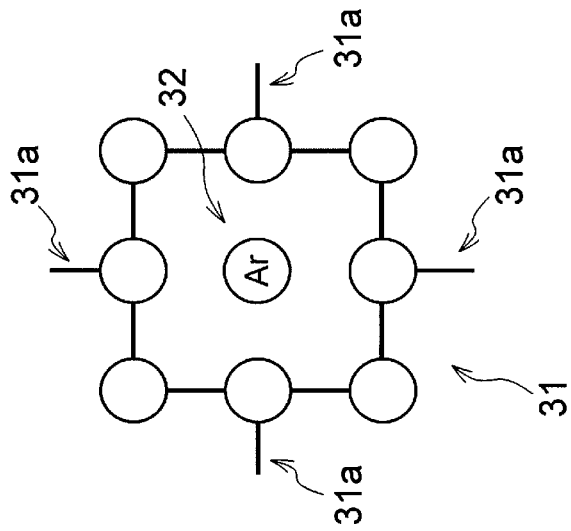
FIGS. 10A and 10B schematically depict aspects related to an adsorption promoting layer according to a third embodiment.
Figure 10A:
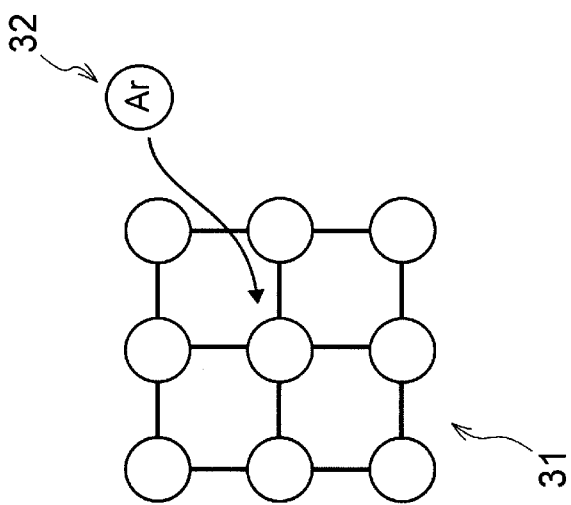

FIGS. 10A and 10B are schematic views illustrating aspects related to the adsorption promoting layer 6 of a third embodiment.

FIG. 10A illustrates an $AlO_x$ film 31 (which is an example of the insulating film 5b) of the third embodiment and an argon (Ar) atom 32. The circles in the $AlO_x$ film 31 represent the Al and O atoms. FIG. 10A illustrates a process of injecting an Ar atom 32 as an impurity atom into the $AlO_x$ film 31.

FIG. 10B illustrates the $AlO_x$ film 31 into which the Ar atom 32 has been injected. When manufacturing the semiconductor device of the third embodiment, in the step illustrated in FIG. 5, the Ar atom 32 is injected into the $AlO_x$ film 31 from the surface of the $AlO_x$ film 31. As a result, the adsorption promoting layer 6 containing aluminum, oxygen, and argon atoms is formed from the $AlO_x$ film 31 at the surface of the $AlO_x$ film 31. In this way, the adsorption promoting layer 6 is formed on the surface of the insulating film 5b.

Since the Ar atom 32 is a noble gas atom, it has no unpaired electrons. Thus, when the Ar atom 32 is injected into the $AlO_x$ film 31, unpaired electrons of the atoms adjacent to the Ar atom 32 are left unbonded, and these unpaired electrons will result in a dangling bond 31a on the surface of the $AlO_x$ film 31. Thus, dangling bonds 31a are formed on the surface of the adsorption promoting layer 6, and a $TiCl_3^+$ ion 24 can be bonded to the dangling bonds 31a. Thus, according to the third embodiment, by injecting the Ar atom 32 into $AlO_x$ film 31, it is possible to promote formation of the barrier metal layer 7a on the surface (via the adsorption promoting layer 6) of the insulating film 5b.

The atoms injected into the $AlO_x$ film 31 may be a noble gas atom other than argon, and may be, for example, helium (He) atoms or neon (Ne) atoms. When He atoms or Ne atoms are used, since the atomic radii of these atoms is relatively small, it is possible for the adsorption promoting layer 6 to contain noble gas atoms at a higher density and thus produce more dangling bonds. On the other hand, when argon is used, since the atomic weight of argon atoms is large, it is possible to limit the diffusion of the Ar atoms 32 from the adsorption promoting layer 6 and to maintain the dangling bonds in the adsorption promoting layer 6.

As described above, the adsorption promoting layer 6 of the third embodiment contains a noble gas element such as helium (He), neon (Ne), or argon (Ar) as an impurity element. Thus, according to the third embodiment, it is possible to promote formation of the barrier metal layer 7a on the surface (via the adsorption promoting layer 6) of the insulating film 5b.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
   a stacked film including a plurality of electrode layers alternating with a plurality of insulating layers;
   a channel layer formed in a hole extending through the stacked film;
   a charge storage layer formed between the channel layer and the stacked film;
   a first insulating film between the stacked film and charge storage layer;
   a second insulating film between the charge storage layer and the channel layer;

a third insulating film between each electrode layer in the plurality of electrode layers and respectively adjacent insulating layers in the plurality of insulating layers, the third insulating film also being between the first insulating film and each electrode layer in the plurality of electrode layers; and an adsorption promoting layer formed on surfaces of the third insulating film facing each respective electrode layer in the plurality of electrode layers, wherein the third insulating film comprises a first metal element and a first element, the adsorption promoting layer comprises a second element and a third element, each respective electrode layer includes a first electrode layer and a second electrode layer surrounded by the first electrode layer, the first electrode layer is between the second electrode layer and the third insulating film, the first electrode layer comprises a second metal element, the second electrode layer comprises a third metal element, the first electrode layer is in direct contact with the adsorption promoting layer, the adsorption promoting layer is in direct contact with the third insulating film, and a difference in electronegativity between the second element and the third element is larger than a difference in electronegativity between the first metal element and the first element.

2. The semiconductor device according to claim 1, wherein
the first metal element is aluminum, and
the second metal element is titanium.

3. The semiconductor device according to claim 1, wherein
the second element is one of titanium, zirconium, hafnium, yttrium, scandium, lanthanum, or tantalum, and
the third element is oxygen.

4. The semiconductor device according to claim 1, wherein
the second element is one of zirconium, hafnium, yttrium, or lanthanum, and
the third element is chlorine.

5. The semiconductor device according to claim 1, wherein
the second element is one of silicon, titanium, zirconium, hafnium, yttrium, scandium, lanthanum, tantalum, or vanadium, and
the third element is fluorine.

6. The semiconductor device according to claim 1, wherein a thickness of the adsorption promoting layer is in a range of 0.1 nm to 0.5 nm.

7. The semiconductor device according to claim 1, wherein
an electrical resistivity of the first electrode layer is higher than an electrical resistivity of the second electrode layer, and
a thickness of the first electrode layer is 2.0 nm or less.

8. The semiconductor device according to claim 1, wherein a dielectric constant of the third insulating film is higher than a dielectric constant of the first insulating film.

9. The semiconductor device according to claim 1, wherein the third element is one of boron, carbon, nitrogen, gallium, germanium, or arsenic.

10. The semiconductor device according to claim 1, wherein the adsorption promoting layer further comprises a noble gas element.

11. A semiconductor device, comprising:
a stacked film including a plurality of electrode layers alternating with a plurality of insulating layers;
a channel layer formed in a hole extending through the stacked film;
a charge storage layer between the channel layer and the stacked film;
a first insulating film between the stacked film and charge storage layer;
a second insulating film between the charge storage layer and the channel layer;
a third insulating film between each electrode layer in the plurality of electrode layers and respectively adjacent insulating layers in the plurality of insulating layers, the third insulating film also being between the first insulating film and each electrode layer in the plurality of electrode layers; and
an adsorption promoting layer formed on surfaces of the third insulating film facing each respective electrode layer in the plurality of electrode layers, wherein
the third insulating film comprises a first metal element and a first element,
the adsorption promoting layer comprises a second element, a third element, and fourth element,
each respective electrode layer comprises a first electrode layer and a second electrode layer, the second electrode layer including a second metal element,
the first electrode layer is between the second electrode layer and the third insulating film,
the fourth element is a noble gas element,
the first electrode layer is in direct contact with the adsorption promoting layer, and
the adsorption promoting layer is in direct contact with the third insulating film.

12. The semiconductor device according to claim 6, wherein the second element is a metal element.

13. The semiconductor device according to claim 12, wherein the third element is oxygen.

14. The semiconductor device according to claim 13, wherein the fourth element is one of helium, neon, or argon.

* * * * *